United States Patent [19]

La Zor

[11] Patent Number: 4,475,196

[45] Date of Patent: Oct. 2, 1984

[54] INSTRUMENT FOR LOCATING FAULTS IN AIRCRAFT PASSENGER READING LIGHT AND ATTENDANT CALL CONTROL SYSTEM

[76] Inventor: Clair G. La Zor, 13054 Rose St., Cerritos, Calif. 90701

[21] Appl. No.: 241,047

[22] Filed: Mar. 6, 1981

[51] Int. Cl.³ .................... G06F 11/22; B64D 11/00
[52] U.S. Cl. .............................. 371/29; 244/118.5
[58] Field of Search ................. 371/29; 244/118.5; 324/51; 340/27 R; 364/200, 900, 424

[56] References Cited

U.S. PATENT DOCUMENTS

| | | | |
|---|---|---|---|
| 3,370,813 | 2/1968 | Albertine et al. | 244/118.5 |
| 3,798,611 | 3/1974 | Gallant et al. | 364/900 |
| 3,988,603 | 10/1976 | Griffin | 371/29 X |
| 4,006,320 | 2/1977 | Märkl | 371/29 X |
| 4,041,455 | 8/1977 | Norberg | 371/29 X |

Primary Examiner—David H. Malzahn
Attorney, Agent, or Firm—Charles H. Thomas

[57] ABSTRACT

A testing instrument is especially adapted for use in locating faults in the passenger reading light and flight attendant call control systems which are used in jumbo jetliners. The testing instrument includes a selection means for designating one of a plurality of series connected passenger locations. Each passenger location includes a proximately located group of two or three passenger seats. The instrument includes indicators for registering data transmitted from the passenger location to a section timer that controls input from and output to passenger locations in an aircraft cabin on a timed, multiplexed basis. The instrument also monitors transmission of data from the section timer to the selected passenger location and includes detectors for registering faults in timing and parity pulses. The instrument includes test controls to create particular conditions of the reading light and attendant call controls, and also a meter for detecting abnormalities in voltage drops at each of the serially connected passenger locations.

14 Claims, 11 Drawing Figures

INSTRUMENT FOR LOCATING FAULTS IN AIRCRAFT PASSENGER READING LIGHT AND ATTENDANT CALL CONTROL SYSTEM

BACKGROUND OF THE INVENTION

1. Field of the Invention

The present invention relates to an instrument for testing a time multiplexed passenger reading light and flight attendant call control system in a commercial aircraft.

2. Description of the Prior Art

Most commercial aircraft designs employ control systems by means of which seated passengers are able to operate overhead reading lights and indicators for calling flight attendants to their seats. Typically, separate buttons are provided in the arm of each aircraft seat, or in a center console between two seats, to operate individual overhead reading lights and an indicator for attracting flight attendant attention to a seat location.

Originally the passenger controls for lighting and flight attendant calling systems were electrical controls coupled by wires that passed in dedicated fashion from the arm of the aircraft seat, beneath the floor of the aircraft and upwardly into the panel space above the passenger location. The operating signals for each passenger's light and call indicator were therefor independent of signals from any other passenger seat. Accordingly, malfunctions in the passenger reading light and flight attendant calling systems at any passenger location were readily isolated and could be associated without difficulty with the particular seat controls and indicators where the malfunction manifested itself.

With the advent of the large commercial aircraft known as jumbo jetliners, a different type of passenger reading light and flight attendant call control system was implemented. Such jumbo jetliners include the DC-10 airplane manufactured by McDonnell Douglas Corporation of Long Beach, Calif., the model 747 aircraft manufactured by Boeing Aircraft Corporation of Renton, Wsh., the model A300 aircraft manufactured by Airbus Industrie of Toulouse, France, and the model L-1011 aircraft manufactured by Lockheed Aircraft Corporation of Burbank, Calif. In commercial jumbo jetliners the large number of wires necessary to provide dedicated controls for each passenger seat to an individual reading light and a flight attendant indicator at a particular passenger location would have created an inordinately great weight. That is, the weight of the wires necessary to provide separate, individually connected controls for each passenger seat was unacceptably large in an aircraft in which every feasible means of eliminating unnecessary weight must be employed. Accordingly, a multiplexed control system was devised in which reading lamps and flight attendant call indicators and controls at each passenger seat were operated on a time-shared, multiplexing system through a central control known as a section timer.

One such multiplexed control system is manufactured for use in the DC-10 aircraft by Hughes Aircraft Corporation of Irvine, Calif. as the model 1022000 multiplex PE/PS System. The Boeing 747 employs a comparable control system known as the ISC system, manufactured by Instrument Systems Corporation of El Segundo, Calif. A new Boeing model 767 aircraft will employ a Panasonic system manufactured by Matsushita Industries in Osaka, Japan or alternatively a system manufactured by Hamilton Standard, a division of United Technologies.

In the Hughes system several modules of the control are each located in association with the aircraft. A section timer govers operation of the control system within each passenger cabin. Beneath each passenger location, which is a group of two or three seats abreast in a cabin, there is a seat encoder which receives signals from all of the individual passenger controls from the seats at that passenger location, and provides a control signal to the flight attendant call indicator at that passenger location. Above the passenger seats at each passenger location, hidden behind overhead panels, there is an overhead decoder which provides operating control signals to the individual passenger reading lights.

The seat locations within a cabin are organized into left and right-hand columns running the length of the airplane. The seat encoders at the passenger locations in each column are connected in series in a loop to the section timer. Likewise, the overhead decoders at each passenger location in each column are also serially connected in a loop to the section timer in the same serial order as the seat encoders associated with the same passenger locations. The section timer cyclically operates to first interrogate a seat encoder and to receive data therefrom on a seat encoder data bus. The section timer then transmits the data to the associated overhead decoder on an overhead decoder data bus and proceeds to the next passenger location in series. In this way the seat encoders are interrogated and the overhead decoders are actuated in time series multiplexed fashion on common data buses.

While such a multiplexing arrangement reduces the necessary weight for a passenger reading light and flight attendant call control system in an aircraft, the interrelationship and common connections of the plurality of controls and actuating systems presents considerable difficulties in locating and remedying malfunctions. Such difficulties are aggravated in the case of multiple malfunctions. Thus, although the passenger reading light and flight attendant calling control systems provide a comfortable amenity to passengers in jumbo aircraft, they contribute inordinately to flight delays and aircraft down time. Moreover, the conventional techniques of isolating and correcting such malfunctions are extremely labor intensive and require a considerable expenditure of time by skilled technicians in locating and correcting troubles.

It is not at all unusual for aircraft to be grounded for many hours, and sometimes even days while technicians attempt to locate troubles in multiplexed passenger reading light and flight attendant call control systems. Moreover, the difficulties in isolating troubles in such systems leads to a great deal of needless work. It is quite time consuming to remove and lower the overhead panels above the passenger seat locations for access to the overhead decoders. Nevertheless, it is not unusual for it to be necessary to drop the overhead panels at many, and sometimes all passenger locations in order to locate an elusive trouble in the system. The time required to locate and correct problems in this fashion with conventional trouble-shooting equipment is considerable.

Also, although the seat encoders are more easily accessible, they are tied to the emergency oxygen mask supply controls. Each time access to a seat encoder is necessary, Federal Aeronautical Administration regulations require a test drop of all oxygen masks in the cabin affected. The necessary testing for oxygen flow through the masks and restoration of the masks to their concealed positions is extremely time-consuming.

As a result of the considerable difficulties encountered in locating and solving problems in a multiplexed passenger reading light and flight attendant calling systems, there is a tendency among airline personnel to ignore slight malfunctions of that system since such problems do not affect the safety of the aircraft. As a result, problems in the reading light and call control tend to accumulate over a period of time. Eventually, a problem will occur in the system which can no longer be ignored, such as the simultaneous blinking of a number of overhead reading lights, or the failure of any of the reading lights in a loop to respond to actuation of a reading light button by any of the passengers. In such circumstances it is necessary to take the aircraft affected out of service until these problems can be corrected. When such a malfunction reflects an accumulation of problems, however, the situation is frequently one in which multiple problems exist. Since these problems can be located using conventional test equipment only with considerable difficulty, the aircraft is frequently out of service for an extended period of time.

SUMMARY OF THE INVENTION

According to the present invention an instrument is provided which can be coupled by means of an existing jack and plug connection to the section timer for the passenger reading light and flight attendant call control system. The instrument includes a manually operable selector for selectively designating each of the plurality of passenger locations connected to the section timer. The selector identifies digital data from the seat encoder associated with the selected passenger location. A temporary storage register is connected to the selector for latching in the identified data, and the display of the data is provided on the face of the instrument.

According to the invention, the data associated with each seat encoder and overhead decoder can be isolated and observed. Also, testing conditions can be imposed upon the system from the front panel of the instrument. Specifically, switches on the instrument can be employed to turn all of the reading lights on, turn them all off, or allow them to remain in the condition to which they have been operated. The same conditions can be imposed upon the flight attendant call lights. The instrument can be directed to either the right or left-column of seat encoders and overhead decoders, to the exclusion of the other column, and the direction of section timer interogation along the seat encoder and overhead decoder loops can be controlled and reversed. Parity signals from the seat encoders and timing strobe signals from the seat encoders and overhead decoders can be observed, as can voltage drops through analog switches associated with each seat encoder and overhead decoder.

With the instrument of the invention, the location and correction of malfunctions in the multiplexed aircraft passenger reading light and attendant call control system is greatly facilitated.

The invention may be described with greater clarity and particularity by reference to the drawing figures.

DESCRIPTION OF THE EMBODIMENT

Figures 1, 8, 9, 10:
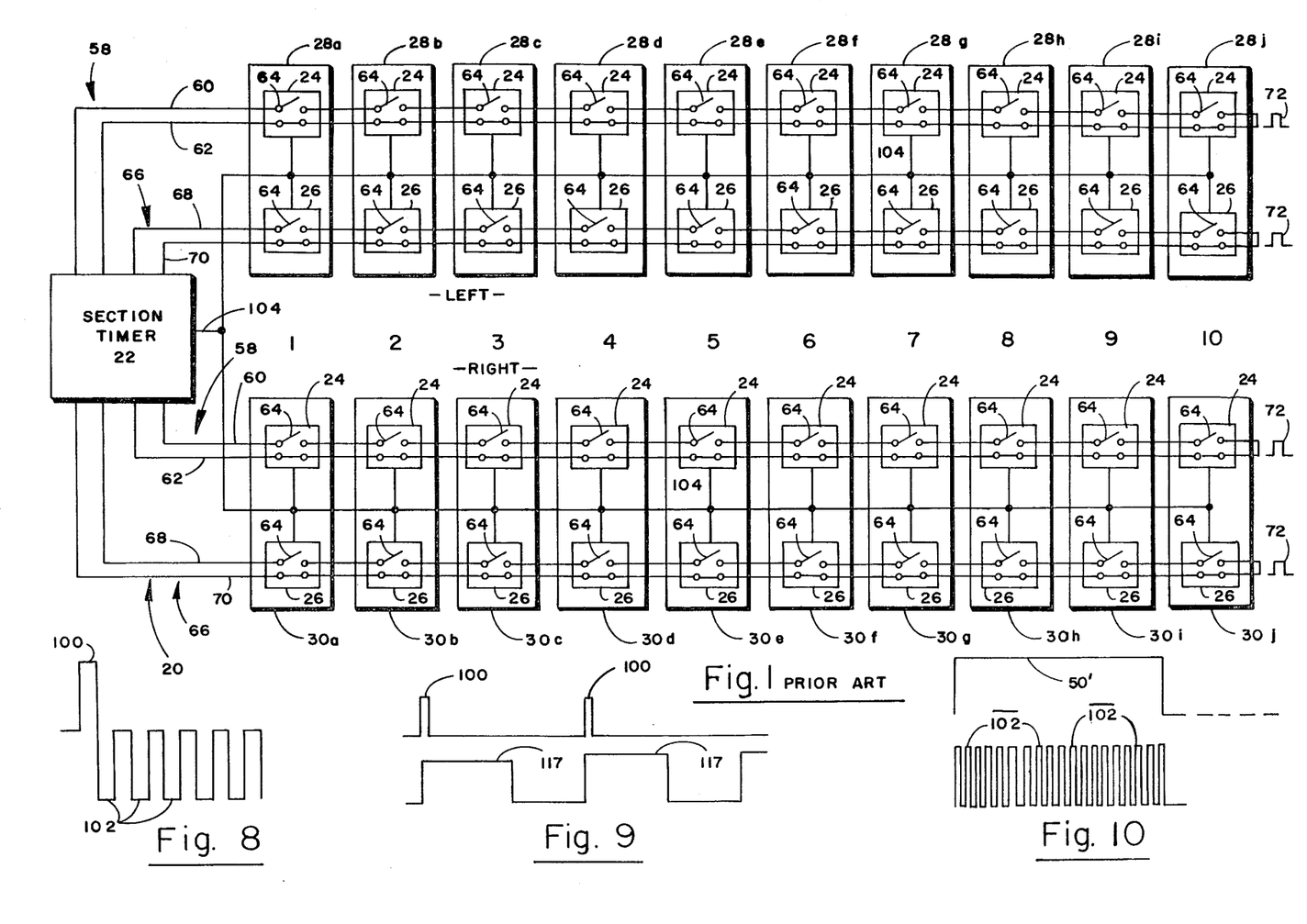
FIG. 1 illustrates diagrammatically the arrangement of a prior art passenger reading light and attendant call control system with which the instument of the invention may be utilized.
FIG. 8 is a pulse diagram indicating pulses on the system clock line.
FIG. 9 is a pulse diagram useful in explaining the operation of the circuit of FIGS. 3A and 3B.
FIG. 10 is another pulse diagram useful in explaining the operation of the circuit of FIG. 3.

FIG. 1 illustrates a multiplexed aircraft passenger reading light and flight attendant calling control system 20. The system 20 illustrates diagrammatically a module of the model 1022000, Multiplex PE/PS aircraft passenger reading light and attendant call control system manufactured by Hughes Aircraft Corporation of Irvine, Calif. The system 20 includes a section timer 22 which is the centralized controller for seat encoders 24 and overhead decoders 26 located at passenger locations 28a, 28b, 28c, etc. and 30a, 30b, 30c, etc. For convenient reference, the passenger locations 28a and 30a are designated by the number 1 to indicate their sequential position in loops connected to the section timer 22. Similarly, the passenger locations 28b and 30b are numbered 2, passenger locations 28c and 30c are numbered 3, and so forth.

Each pasenger location 28a, 28b, 28c . . . 30a, 30b, 30c . . . includes at least one, and more typically two or three passenger seats, each seat having individual controls for an overhead reading light and for a flight attendant calling indicator. Each passenger location has a seat encoder 24 and an overhead decoder 26. The overhead decoder 26 controls the operation of individual reading lights associated with each seat at each passenger location.

Figures 4, 7:
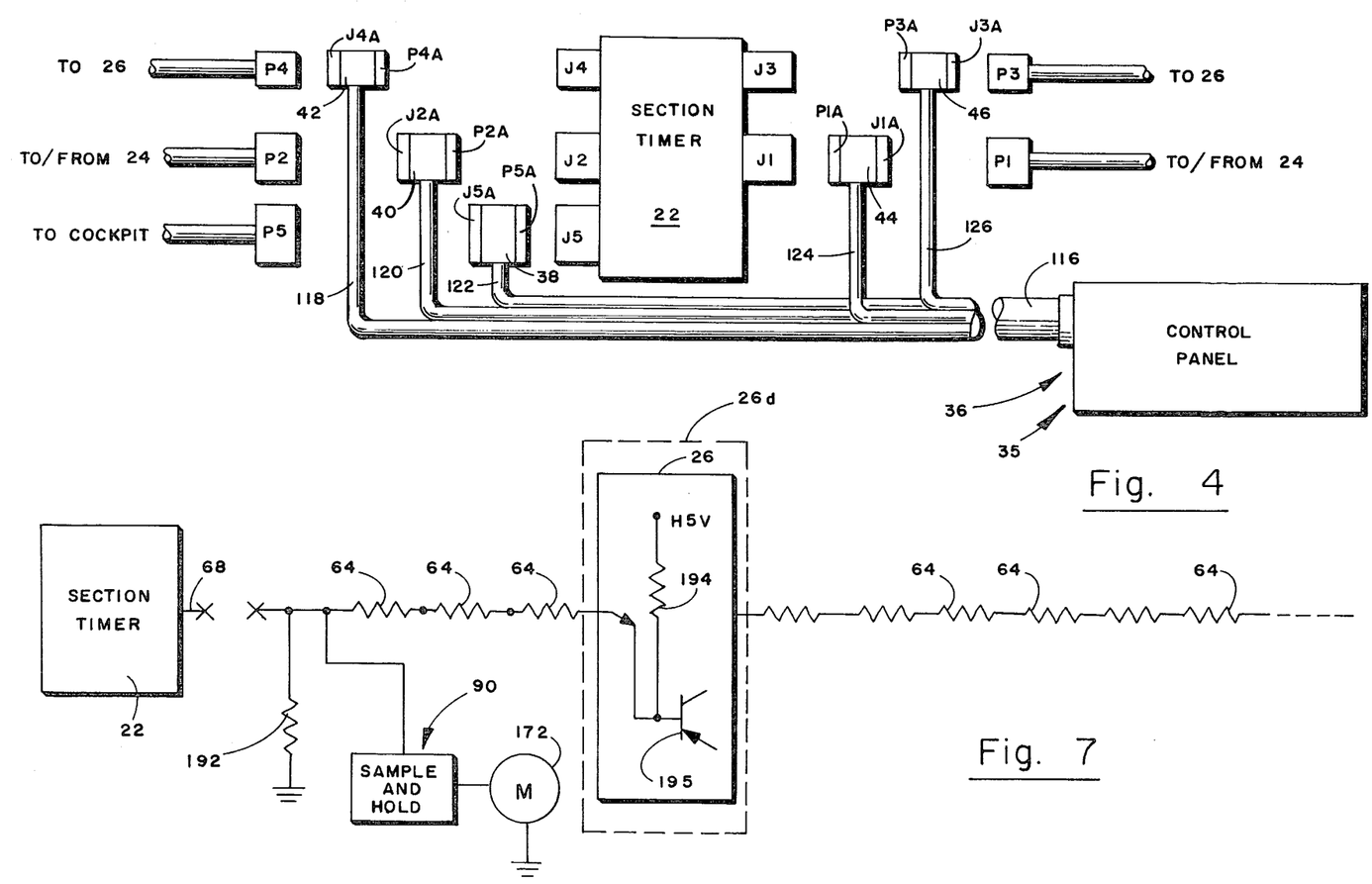
FIG. 4 depicts the interconnection of the instrument of the invention with existing jack and plug connections in the system of FIG. 1.
FIG. 7 illustrates diagrammatically the use of the instrument of FIGS. 2 and 3 to detect abnormal voltage drops in the overhead decoders depicted in FIG. 1.
Figures 5, 6:
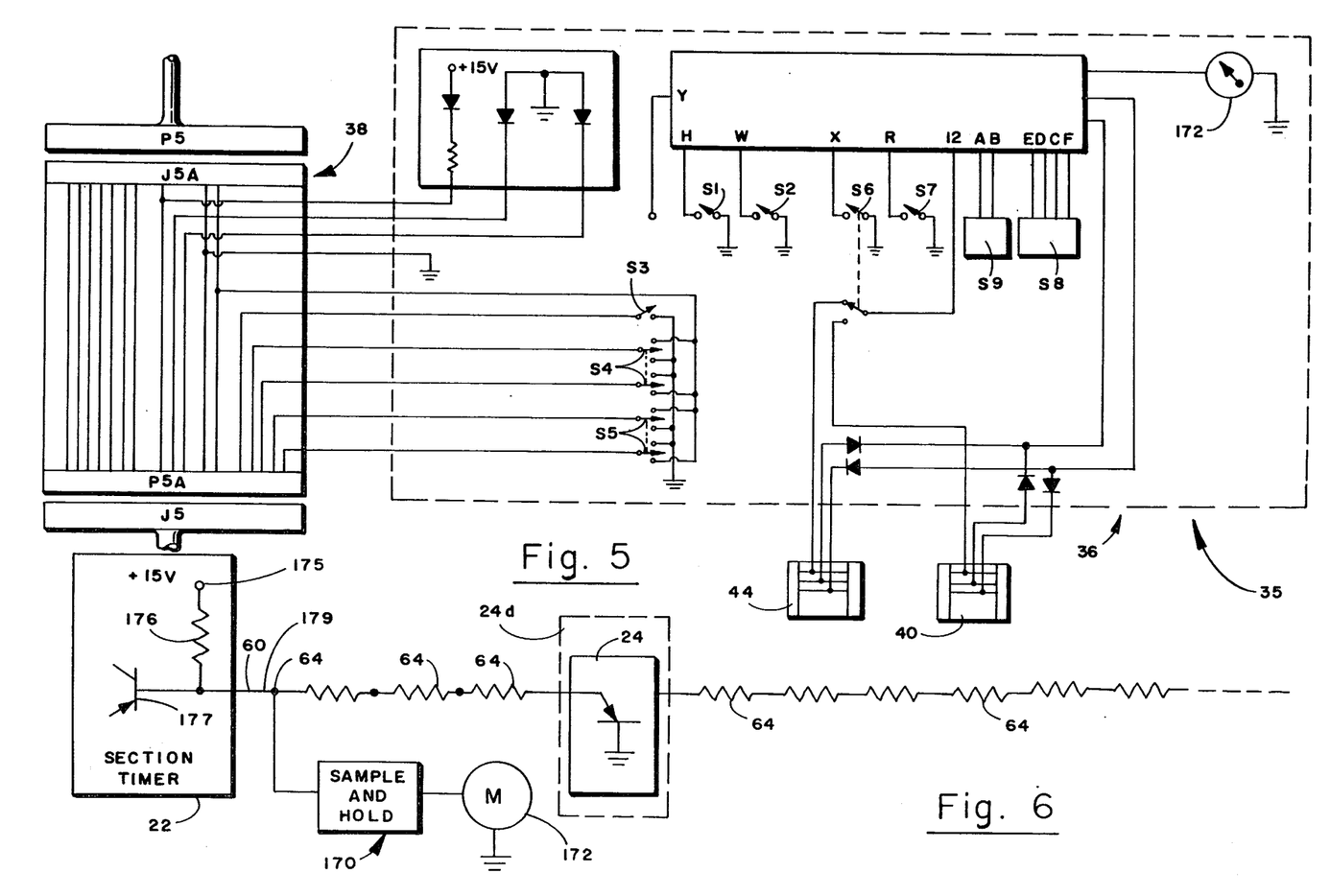
FIG. 5 illustrates the electrical interface circuity of the connections of FIG. 4.
FIG. 6 illustrates diagrammatically the manner in which the instrument of FIGS. 2, 3A and 3B detects abnormal voltage drops in the seat encoders depicted in FIG. 1.

The instrument of the invention is designated at 35 in FIGS. 4 and 5, and includes a control and display panel 36. The instrument also includes interface connectors 38, 40, 42, 44 and 46, depicted in FIG. 4, which couple the instrument 35 to the section timer 22, the seat encoders 24 and the overhead decoders 26 to received digital data from the seat encoders 24 and to transmit electrically encoded data to the seat encoders 24 and to the overhead decoders 26.

Figure 2:
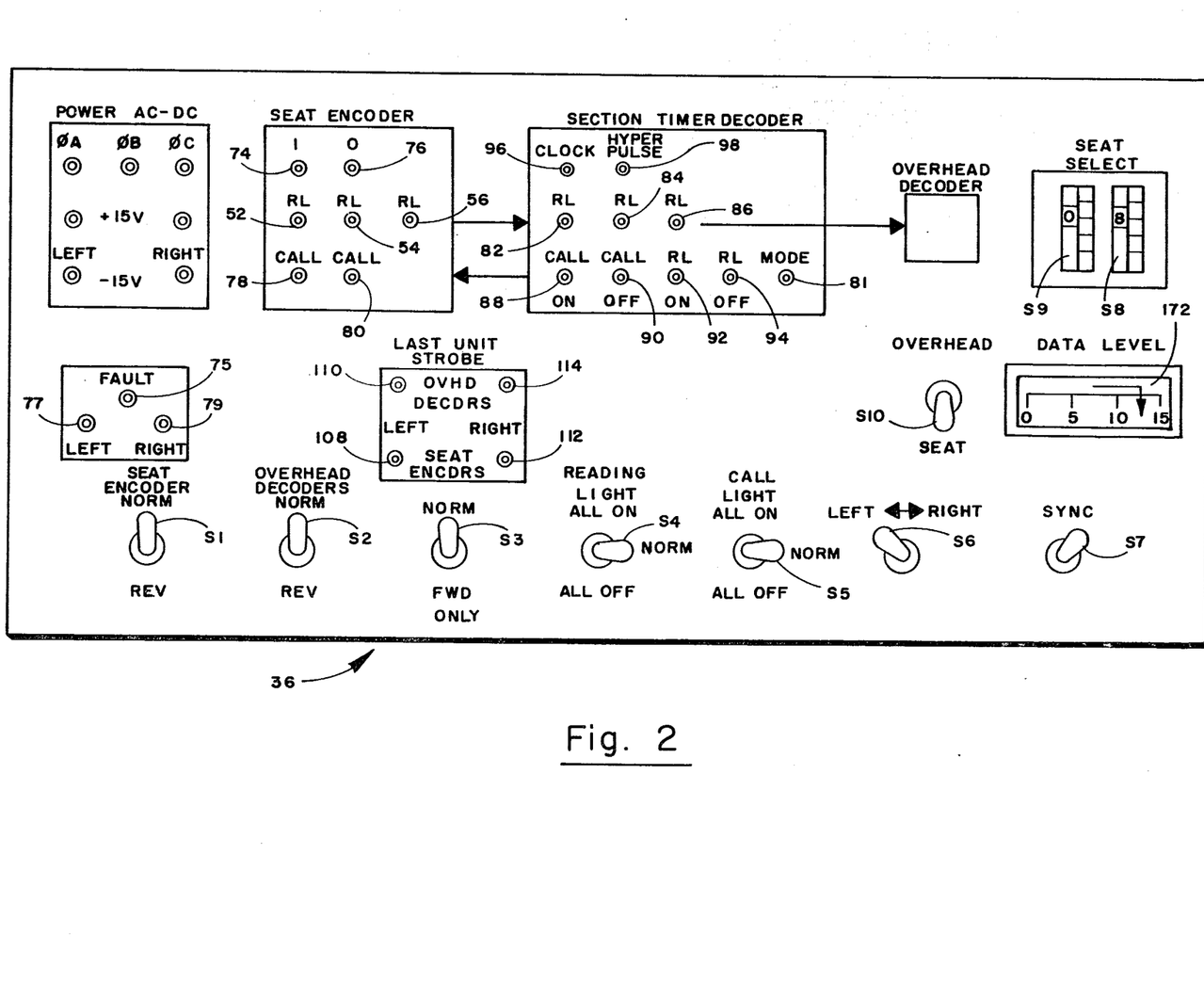
FIG. 2 illustrates the face of the instument of the invention bearing the visual display indicator and manually operable controls.
Figure 3A:
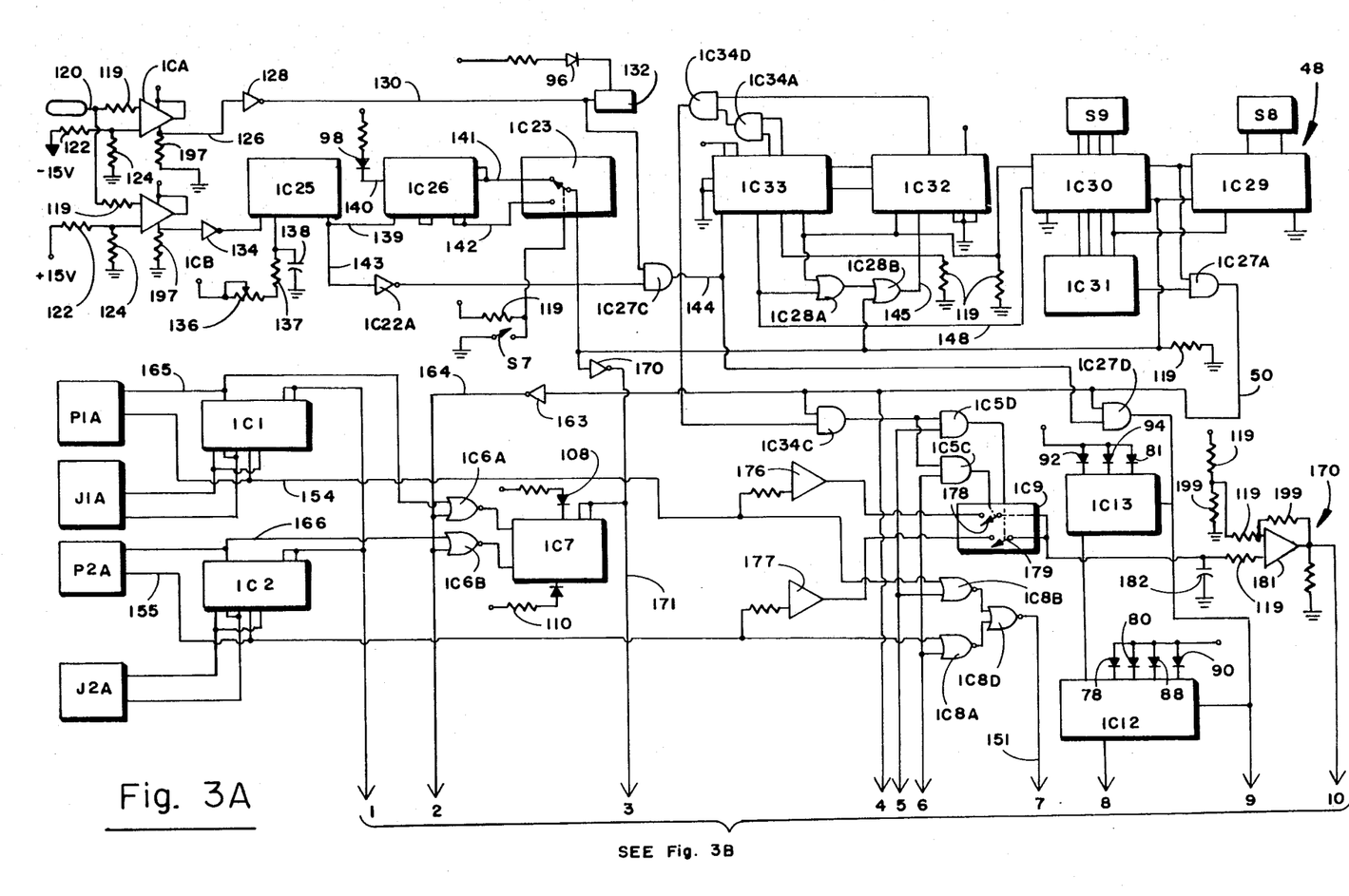
FIGS. 3A and 3B are schematic diagrams of the logic circuitry of the instrument of the invention.
Figure 3B:
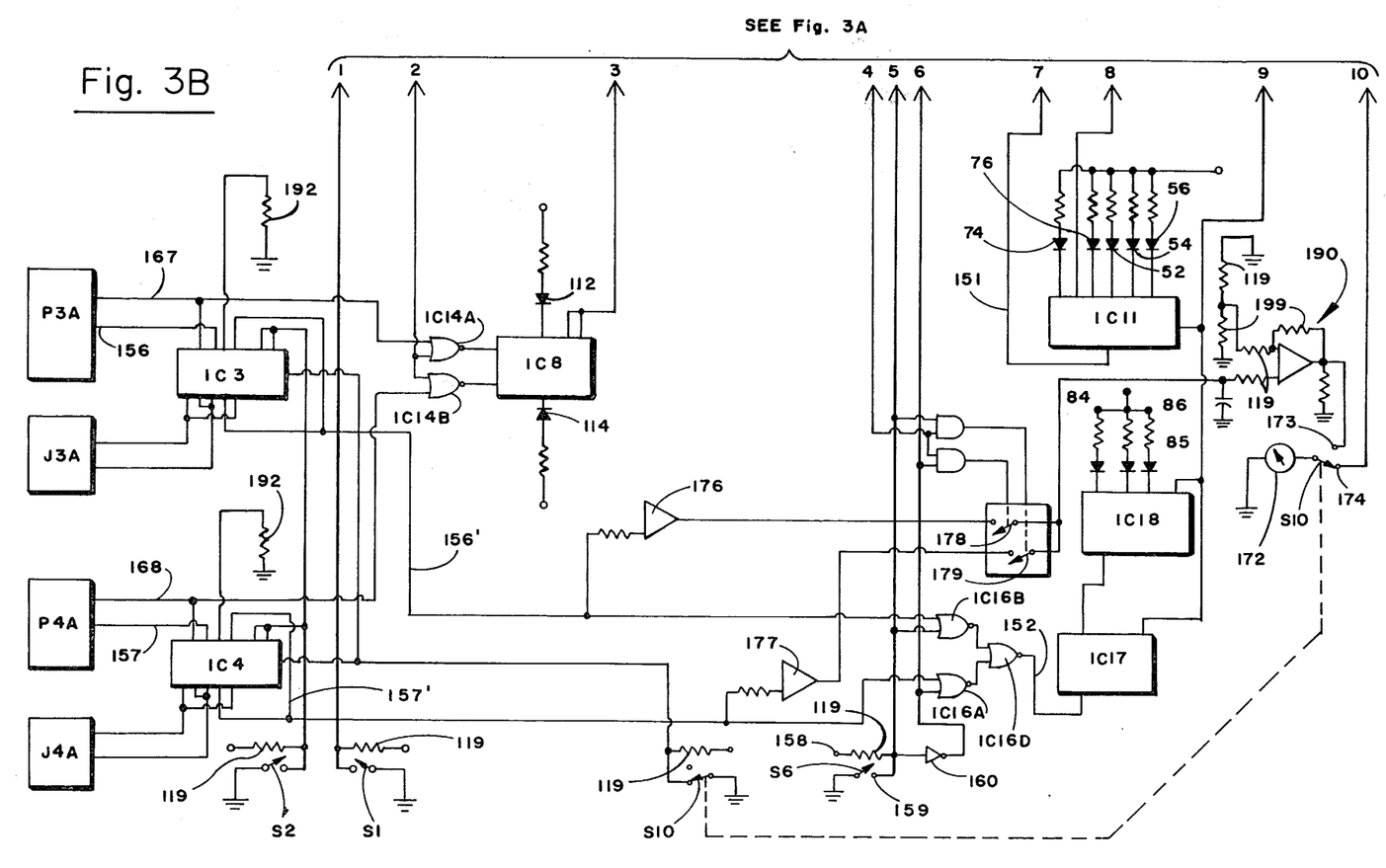

The instrument of the invention includes a selection means 48, depicted in FIG. 3A, which has thumbwheel switches S8 and S9, also depicted in FIG. 2. The selector 48 selectively designates one of a plurality of passenger locations at the selected one of the sequential positions 1 through 10 of FIG. 1. The selector 48 identifies digital data from the selected seat encoder 24 associated with the selected passenger location and with a selected column by means of an enable pulse on line 50 of FIG. 3A. The line 50 is coupled to an AND gate IC27D which gates in data to shift registers IC11 (FIG. 3B), IC12 and IC13, which serve as temporary storage registers. The shift registers IC11, IC12 and IC13 are connected to the selector 48 for latching the data identified with the seat encoder of the particular passenger location selected. Light emitting diodes 52, 54, 56, 74–81, and 90–94, illustrated in FIGS. 2, 3A and 3B, are visual display elements which are coupled to the shift registers IC11, IC12 and IC13 for visually indicating the identified data.

Organization of Reading Light and Flight Attendant Call Control System

The multiplexed aircraft passenger reading light and flight attendant call control system 20 depicted in FIG. 1 will accomodate up to 34 passenger locations in each of two columns, which are designated as left and right columns in FIG. 1. In the embodiment depicted in FIG. 1, only 10 passenger position 28a, 28b . . . 28j are present in the left column. Likewise, only 10 passenger positions 30a, 30b, 30c . . . 30j are present in the right column. The passenger location 28a, 28b, 28c, . . . 28j are electrically connected with the seat encoders 24 therein by means of a loop 58 that includes a forward data line 60 and a backward data line 62. The forward data line 60 leads from the section timer 22 and serially connects the seat encoders 24 at the passenger locations 28a, 28b, . . . in the order indicated. at each of the seat encoders 24 there is an analog switch 64 in the forward data line 60. the backward data line 62 passes through the seat encoders 24, but is connected at through terminations and is not switched.

The backward data line 62, in normal operation, provides a strobe signal path from the last of the serially connected seat encoders 24 in the passenger location 28j to the section timer 22. In the convention of installation which is practiced currently, the first passenger location 28a includes the seats in the rear-most row of the cabin. The second passenger location 28b indicates the seats in the second row from the rear of the cabin, and so forth. The passenger location 28j therefore includes the passenger seats located furthest forward in the cabin.

The overhead decoders at the same passenger locations 28a, 28b, 28c . . . are likewise serially connected in an overhead decoder loop 66 in correspondence to the seat encoder loop 58. The overhead decoder loop 66 includes a forward data line 68 which leads from the section timer 22 through analog switches 64 in the serially connected overhead decoders 26. The overhead decoder loop 66 also includes a backward data line 70 that provides a strobe signal path from the last of the serially connected overhead decoders 26 when the section timer 22 addresses the overhead decoders 26 on the forward data line 68.

The section timer 22 alternatingly addresses both the seat encoders 24 and the associated overhead decoders 26 at each passenger location in sequence. Interrogation is conducted first on the forward data line. When all of the seat encoders 24 and overhead decoders 26 have been addressed in sequence on the forward data line, the section timer 22 then addresses the seat encoders 24 and overhead decoders 26 in sequence on the backward data line. The direction of interrogation is cyclically reversed in this fashion.

At the conclusion of interrogation of each seat encoder 24, and at the conclusion of interrogation of each overhead decoder 26, the analog switch 64 therein is closed and a strobe pulse is generated and passed to the next sequential seat encoder 24 and overhead decoder 26 in each of the loops 58 and 66. The strobe pulse from each seat encoder 24 and each overhead decoder 26 closes the normally open switch 64 in the next sequential seat encoder 24 and overhead decoder 26 to allow interrogation of data from that next sequential seat encoder 24 and transmission of data to that next sequential overhead decoder 26.

The last unit strobe pulses from the last passenger locations 28j and 30j on the data loops 58 and 66 are diagramatically depicted at 72 in FIG. 1 and are passed on the backward data lines in those loops to the section timer 22 to inform the section timer 22 that a complete cycle of interrogation and data transmission to all of the passenger locations 28a–28j and 30a–30j has been completed.

In normal operation of the system, the next sequence of interrogation and data transmission progresses in the opposite direction on the loops. That is, passenger locations 28j and 30j are first addressed on the backward data lines 62 and 70. Strobe pulses from the passenger locations 28j and 30j are passed to the seat encoders 24 and overhead decoders 26 at the next passenger locations 28i and 30i. When interrogation and data trnsmission is complete at passenger locations 28i and 30i, strobe pulses are passed to the seat encoders 24 and overhead decoders 26 at passenger locations 28h and 30h. Ultimately, the strobe pulses from passenger locations 28a and 30a are carried on the forward data lines 60 and 68 to notify the section timer 22 that the last unit has been addressed. The direction of interrogation and data transmission in the loops 58 and 66 is reversed with each cycle.

The loop transmission arrangement from the section timer 22 is duplicated in the left column passenger locations 28a, 28b, 28c . . . 28j and in the right column passenger locations 30a, 30b, 30c . . . 30j. That is, a separate seat encoder loop 58 is provided to the seat encoders 24 in both the left and right columns of passenger locations. Each seat encoder loop 58 includes a forward data line 60 and a backward data line 62. The seat encoders 24 in the right column of passenger locations also include the analog switches 64, as do the overhead decoders 26. The overhead decoders 26 in the passenger locations 30a, 30b, 30c . . . are connected in a data loop 66 that includes a forward data line 68 and a backward data line 70. The sequence and alternating direction of interrogation and data transmission by the section timer 22 is conducted concurrently in the right column of passenger locations, 30a, 30b, 30c . . . as in the left column of passenger locations 28a, 28b, 28c . . .

Instrument Switch Controls

In the instrument 35 the switches S1–S9 are all manually operable switches on the instrument panel 36. The switches S1, S2 and S3 are provided for suppressing the alternating reversal of direction of addressing by the section timer 22 and for selectively controlling the direction of addressing on the loops 58 and 66. With switches S1 and S2 in the positions indicated in FIG. 2, the switch S3 when moved to the FWD ONLY position on the instrument panel 36 of FIG. 2 confines addressing by the section timer 22 to the forward data lines 60 and 68 of the loops 58 and 66 of FIG. 1 by means of the circuit connections illustrated in FIGS. 3A, 3B and 4. Addressing will no longer be reversed with each cycle of operation when the switch S3 is moved to this position. With the switches S1 and S2 in the NORM position, the section timer 22 will address the seat encoders 24 and the overhead decoders 26 only on the forward data lines 60 and 68, when switch S3 is in the FWD ONLY position.

Using the instrument of the invention, it is possible to address the seat encoder loop 58, the overhead decoder loop 66, or both the loops 58 and 66 only on the backward data lines 62 and 70. To address the seat encoders 24 on the backward data lines 62, the switch S3 is moved to the FWD ONLY position and the switch S1 is moved to the REV position on the instrument panel 36 in FIG. 2. The switch S3 then limits adddressing to a single direction, which would normally be forward, but the switch S1 reverses this direction. Similarly, actuation of switch S2 to the REV position will cause the section timer 22 to address the overhead decoders 26 only on the backward data lines 70 with each cycle of operation, rather than to cyclically reverse the direction of addressing as occurs in normal operation of the control system 20.

The switches S1, S2 and S3 are all toggle switches which operate analog switches in the instrument 35. The switches S1 and S2 can be operated to place a ground on the H and W pins of the logic board 105 of the instrument panel 36, as depicted in FIG. 5. The switch S1 is used to allow reversal of the direction of data transmission between the section timer 22 and the seat encoders 24. The switch S2 allows reversal of the normal direction of data transmission between the section timer 22 and the overhead decoders 26. The switches S1 and S2 are depicted in their normally open positions in FIGS. 2, 3 and 5 in which a positive 15 volt supply is provided through resisters to the CMOS analog switches IC1, IC2, IC3 and IC4, illustrated in FIGS. 3A and 3B. In the open positions illustrated, the switches S1 and S2 allow normal data transmission to occur to and from the section timer 22 through the analog switches IC1-IC4. When the switch S1 is actuated, however, a ground is placed on the analog switches IC1 and IC2, thereby transferring data on the backward data lines 62 to the forward data lines 60 and transferring data on the forward data lines 60 to the backward data lines 62. Likewise, actuation of the switch S2 places a ground on the analog switches IC3 and IC4 to reverse the lines 68 and 70 upon which data is transmitted to and from the overhead decoders 26.

The capability of control of direction of data transmission on the loops 58 and 66 is quite important during testing because with the actuation of switch S4 to the ALL ON position, the section timer 22 interrogates the seat encoders 24 only on the forward data lines 60, and does not alternate between transmission on the forward data lines 60 and the backward data lines 62, as in normal operation of the system 20. By actuating the switch S1, a test which is normally conducted on the forward data line 60 can be reversed, and conducted on the backward data line 62. The switch S2 can likewise be used to reverse the direction of communication between the section timer 22 and the overhead decoders 26 in a comparable fashion.

When the switches S1 and S2 are in their normal position, the condition of illumination of the LED's 52, 54, 56, 74, 76, 78, 80 and 82-94 represents data associated with a passenger position as counted in the sequence indicated in FIG. 1. For example, with the switches S8 and S9 in the positions indicated in FIG. 2 at the setting "08", data from the eighth seat encoder 24 and eighth overhead decoder 26 at the passenger location 28h or 30h is displayed, according to the setting of switch S6. The passenger position are counted in ascending order along the forward data lines. With the actuation of switches S1 and S2, to the REV position, however, the state of illumination of the LED indicators 52, 54, 56, 74, 76, 78, 80 and 82-94 represents data from the passenger location set by switches S8 and S9 as counted from the last sequential position, that is as counted along the backward data lines. Accordingly, with the switches S8 and S9 in the position indicated in FIG. 2 and with the switches S1 and S2 actuated to the REV position, the data displayed in the LED indicators is from the passenger location 28c or 30c, according to the setting of switch S6, since these are the eighth passenger locations as counted in ascending order along the backward data lines.

Moreover, data from a seat encoder 24 at one passenger location can be displayed concurrently with data from an overhead decoder 26 at a different passenger location in the same column of passenger locations. Operating the switches S1 and S2 in this fashion facilitates determining whether a malfunction is in the seat encoder 24 or the overhead decoder 26 at a particular passenger location. By making this determination, the disadvantages currently encountered and previously described of needlessly disrupting a seat encoder or needlessly taking out an overhead panel are avoided.

An example of the use of switches S1 and S2 in opposing directions may be better explained in association with a problem which typically occurs. It would not be at all unusual for the overhead reading lights in a portion of a column of passenger locations to malfunction in the same manner. For example, the reading lights at passenger locations 28e–28j might well malfunction by blinking together. While the reading lights at passenger locations 28a–28d all test out properly and the problem would appear to be at either passenger location 28d or 28e, it cannot readily be determined whether the problem is in the seat encoder 24 or the overhead decoder 26 at those pasenger locations using conventional testing instruments. If actuation of the switch S1 to the REV position, while switch S2 remained in the NORM position, was accompanied by a shift in the blinking lights from passenger locations 28e through 28j to passenger locations 28a through 28e, this would indicate that the problem was in the seat encoder 24 at passenger location 28e, and not in the overhead decoder 26 at that passenger location. Conversely, if actuation of switch S1 produced no change in the blinking of reading lights in passenger locations 28e-28j, this would indicate that the problem was in the overhead decoder 26 at passenger location 28e. By isolating the source of the problem in this fashion, the unnecessary difficult removal of an overhead decoder 26 can be avoided where the problem lies with a seat encoder 24. In the opposite situation, the unnecessary removal of a seat encoder 24 and the subsequent requirement for an oxygen mask drop can be avoided where the problem is isolated to an overhead decoder 26. At least one of these undesireable procedures can be avoided where the problem can be isolated in this fashion.

The switch S3, as previously noted, is operable to address each passenger location in a column in sequence only on the forward data lines 60 and 68, rather than in alternating directions of transmission between forward and backward data lines as occurs in normal operation of the section timer. The operation of the switch S3, coupled with the operation of the switches S1 and S2, allows the section timer 22 to test on the backward data lines 62 and 70. Such testing has not been possible according to prior techniques. As a result, during testing of the control system 20 according to prior techniques a fault might well appear during operation of the system, although the fault indicator corresponding to the LED 75 would be extinguished during testing. This might well occur because the fault was in the backward data line. by actuating the switches S1 and S2 to the REV positions and by actuating switch S3 to the FWD ONLY position, testing can be carried out on the backward lines to locate troubles that occur on those lines.

It should be noted from FIG. 5 that the switch S3 does not provide a direct input to the logic board 105. Rather, the switch S3 merely brings out to the testing instrument panel 36 a capability for suppressing the operation of the section timer 22 from addressing the seat encoder 24 and the overhead decoders 26 alternatingly as between the forward and backward data lies. The switch S3 confines the addressing function by the section timer 22 to either the forward data lines 60 and 68, with the switches S1 and S2 in the NORM positions indicated in FIG. 1, or to the backward data lines 62 and 70, with the switches S1 and S2 in the REV positions contrary to that indicated in FIG. 1.

The switches S3, S4 and S5 provide a test command capability from the test instrument 35. With reference to FIG. 5, the plug connection 38 includes circuitry for intercepting electrical leads that would otherwise continue through to the plug connection P5 and on to forward flight attendant station. Instead, the plug connection 38 intercepts those leads and brings the connections thereto to the test instrument 35 where contacts are made through the switches S3, S4 and S5. The switches S3, S4 and S5 are not directly connected to the logic board 105.

The tests performed are actually commanded by the section timer 22, but the switches S4 and S5 provide remote test initiating means to the section timer 22 for providing test signal commands. The switch S4 provides a means for initiating a command for all the reading lights to be on or all to be off. Similarly, switch S5 initiatess a command for all the call lights to be on or all to be off. The switch S4 is a manual toggle switch that serves as a separate manually actuable reading light test signal initiating means. The switch S5 serves as an attendant call test signal initiating means. The switches S4 and S5 both provide activating signals to the section timer 22 test switch inputs. The connections to the switch S4 depicted in FIG. 5 include bipolar inputs from the plug connection 38 for turning all of the reading lights on and off. Bipolar inputs are also provided to the attendant call switches through the plug connection 38 to turn all of the attendant calling indicators on and off.

In normal operation the signals indicated by the LED indicators 88, 90, 92 and 94 are all off. However, during testing procedures various situations can be created in which the calling indicators are commanded to be on or off and the reading lights are commanded to be on or off.

Actuation of the switch S5 to the ALL ON position will turn all of the calling indicators in the column of passenger locations addressed on and will illuminate the LED 88. depicted in FIGS. 2 and 3A. Actuation of the switch S5 to the ALL OFF position will command all of the calling indicators to be turned off and will illuminate the LED indicator 90.

Similarly, the switch S4 can be used to command all of the reading lights on by actuation to the ALL ON position, at which time the LED indicator 92 is illuminated. Actuation of the switch S4 to the ALL OFF position will command all of the reading lights in the column addressed to be turned off and will illuminate the LED 94.

Switch S6, depicted in FIGS. 2, 3B, and 5 is directly connected to the logic board 105 and is used to control the temporary storage shift registers IC11, IC12, IC13, IC17 and IC18 to select a single seat encoder loop 58 and a corresponding overhead decoder loop 66 in one of the two columns of passenger locations. The switch S6 operates the shift registers IC11, IC12 and IC13 to select either the left or right-hand column in which the data from the seat encoder loop 58 is stored. The switch S6 also operates the temporary storage shift registers IC17 and IC18 to designate the column from which data on the overhead decoder loop 66 is stored.

The sync switch S7 is depicted in FIGS. 2 and 3A and is a manually actuable toggle switch directly connected to the logic board 105 to resynchronize the instrument 35, should the instrument 35 lose the clock pulse signal 102, depicted in FIG. 8, as sometimes occurs during operation of data swithes S1 and S2, illustrated in FIG. 6. The sync switch S7 resynchronizes the selector 48 to operate in timed relationship with the clock pulses which will hereinafter be described.

The selection of the particular passenger location from which data is to be displayed on the instrument panel 36 is governed by the selector 48 illustrated in FIG. 3, which includes the thumbwheel switches S8 and S9 on the control and display panel 36, also depicted in FIG. 2. The thumbwheel switches may be moved, as indicated in Fig. 2, to address the eighth passenger location. The selector 48 causes data to be displayed from the passenger location 28$h$ in the left column of passenger locations and also the passenger location 30$h$ in the right column, illustrated in FIG. 1. The switch S6 is provided on the panel 36 to limit the display of data to either the left column of passenger locations, 28$a$, 28$b$, 28$c$, . . . , or the right column of passenger locations 30$a$, 30$b$, 30$c$ . . . , according to the direction of actuation indicated in FIGS. 2, 3 and 5.

Switch S10 is a manually actuable toggle switch which is used to switch the meter 172 from monitoring the overhead decoders 26 and the seat encoders 24 by switching between the OVERHEAD and SEAT positions. The use of the meter 172 will be hereinafter described.

INSTRUMENT DISPLAYS

With the switch S6 actuated to the LEFT position to designate the left column of passenger locations, as illustrated in FIG. 2, data from the seat encoders 24 in the passenger locations 28$a$, 28$b$, 28$c$ . . . will be displayed on the instrument panel 36 of FIG. 2 as these passenger locations are addressed by the section timer 22.

The first response of a seat encoder 24 to interrogation by the section timer 22 is to provide parity pulses of opposite polarity in response to a strobe pulse thereto. The polarity of the parity pulses reflects the convention for a condition of actuation of the reading lights and call indicators. In the usual convention actuation of a reading light or a call light switch in the passenger seat control produces a condition of polarity, equal to, "1", while deactuation thereof produces a condition of positive polarity, equal to "0". The parity pulses from the seat encoder 24 which is addressed are transmitted to light emitting diodes 74 and 76, indicated in FIG. 2 and connected to the register IC11 in FIG. 3B. The parity pulses which are transmitted by the seat encoder 24 do not reflect the actuation of any particular switch, but rather reflect the fault or no fault condition of the particular seat encoder. The parity pulses are latched at outputs of register IC11, depicted in FIG. 3B, and the state of these pulses must be consistent with the polarity expected by the section timer 22 in order to illuminate both of the light emitting diodes 74 and 76. If these LED's are not illuminated, the left or right system fault indicator 77 or 79, indicated in FIG. 2, is illuminated, depending upon the state of the actuation of the switch S6. Illumination of either left fault indicator 77 or right fault indicator 79 will also illuminate the fault indicator 75. Under normal operating conditions, the parity pulse indicator LED 74 should be illuminated and LED 76 should be extinguished. If the sequence of the polarity pulses should be reversed, or if the polarity pulses should be of a common polarity, the fault indicators 77 or 79 and 75 will be illuminated.

The panel 36 also includes light emitting diodes 52, 54 and 56, which correspond, respectively, to the state of actuation of the reading lights in the right-hand seat, the left-hand seat, and the center seat (if any) in the passenger location addressed. Illumination of the LED 52 for example, signifies that the reading light switch at the right-hand position of the passenger location interrogated has been actuated, as sensed by the seat encoder 24 thereat. The absence of illumination of the LED 54 signifies that the reading light switch for the left-hand seat at the passenger location interrogated has been deactuated. Similarly, illumination or non-illumination of the light emitting diode 56 indicates, respectively, actuation or deactuation of the reading light switch at the center seat (if any) in the passenger location interrogated.

Either one or both of the LED's 78 and 80 will be illuminated if any one of the call buttons has been depressed at any of the seats in the passenger location interrogated. The distinction as to whether one or both of the LED's 78 and 80 is illuminated lies in the mode of operation. The mode of operation is indicated by the mode LED 81 on the face of the panel 36. Illumination of the mode LED 82 is normal when the control system 20 is employed in the outboard mode, which is in any cabin except for the center section of the first-class cabin. The outboard mode of operation is depicted by the arrangement of FIG. 1. In the inboard mode only a single loop of seat encoders 24 is employed, although two loops of overhead decoders 26 are utilized. The mode of operation is not particularly relevant, to the present invention as the instrument of the invention operates essentially the same regardless of the mode of the operation of the multiplexed passenger reading light and flight attendant call control system 20.

The condition of the LED's 74, 76, 52, 54, 56, 78 and 80 is indicative of data which is transmitted from a seat encoder 24 to the section timer 22. LEDs 82, 84 and 86 are, respectively, indicative of commands from the section timer 22 to an overhead decoder 26 for the reading lights for the left, right and center seats at the passenger location selected with the switches S8 and S9. If there is integrity of communication from the seat encoder 24 to the overhead decoder 26, LED 82 will be in the same condition of illumination as LED 52. LED 84 will be in the same condition of illumination as LED 54 and LED 86 will be in the same condition as LED 56.

The LED's 88, 90, 92 and 94 in the instrument panel 36 are indicative of test data which can be transmitted from the section timer 22 to the seat encoder 24 that is currently addressed. LED 88 is indicative of a command to the seat encoder 24 directing the seat encoder 24 to turn on the flight attendant call indicator. Likewise, LED 90 is indicative of a command to the seat encoder 24 to turn off the calling indicator. In a conventional system 20 these commands can be performed from the forward flight attendant's station to the section timer 22. However, for simplicity in trouble-shooting, the instrument 35 of the present invention intercepts the aircraft's test connections, as depicted in FIG. 5, and provides a capability for initiating these commands. This capability is provided by the switch S5, previously described, depicted on the instrument panel 36 in FIG. 2 and depicted schematically in FIG. 5.

LED's 96 and 98 are also indicative of data transmitted from the section timer 22 to the seat encoders 24. Following each transmission from an interrogated seat encoder 24, the section timer 22, on a time-shared basis, transmits test signals. As part of the procedure for addressing a seat encoder 24 and the overhead decoders 26, the section timer 22 transmits certain timing pulses. The first timing pulse is a sync pulse indicated at 100 in FIG. 8. The sync pulse is a positive-going +15 volt pulse. Following the sync pulse 100 there are a number of negative-going clock pulses 102, which are transmitted at a frequency of 3500 hertz. The clock pulses 102 and the sync pulse 100 are transmitted on clockline 104, indicated in FIG. 1, which is separate from the data lines in each of the loops 58 and 66.

The positive-going sync pulse 100 only occurs at the beginning of each interrogation cycle. Thereafter, throughout the interrogation cycle all of the subsequent pulses on the clockline 104 are negative-going 15 volt clock pulses 102. The sync pulses 100 and the clock pulses 102 are separated, as will hereinafter be described. The sync pulses 100 are divided down and are directed to a sync pulse LED 98, depicted in FIG. 2 and labelled HYPER PULSE on the instrument panel 36. The LED 98 pulses at an observable rate during normal operation of the system. Likewise, the clock pulses 102 are divided down even more than the sync pulses 100 and pulse the CLOCK LED 96 at an observable rate. The rates of pulsing of the LED's 96 and 98 are approximate equal, about once every second. The clock pulse rate of the LED 96 is constant, although the HYPER PULSE LED 98 will flash at a rate that is somewhat dependant on the number of passenger locations in the column monitored. Failure of the LED's 96 and 98 to pulsate is indicative of an error in the timing circuit of the section timer 22, or a short or open circuit in the clockline 104.

The last unit strobe LEDs 108, 110, 112 and 114 in the instrument panel 36 are connected to the appropriate seat encoder and overhead decoder loops. That is, the seat encoder loop 58 of the left column is connected to the indicator 108 and the overhead decoder loop 66 of the left column is connected to indicator 110. The seat encoder loop 58 of the right column is connected to the LED indicator 112 and the overhead decoder loop 66 of the right column is connected to the LED indicator 114.

As previously stated a strobe pulse is generated at the conclusion of data transmission from each seat encoder 24 and a last unit strobe pulse is generated at the conclusion of data transmission to each overhead decoder 26. The last unit strobe pulses 72, depicted in FIG. 1, that are generated by the last seat encoder 24 and the last overhead decoder 26 in sequence are returned on the associated loop to the section timer 22. Return of a last unit strobe pulse 72 is alternatingly on the forward data lines 60 and 68 and on the backward data lines 62 and 70, as previously described. If the system is functioning properly the last unit strobe pulses 72 from the data loops 58 and 66 within each column of passenger locations will arrive at the section timer 22 simultaneously.

When switches S8 and S9 are set to the total number of passenger locations in the cabin, simultaneous receipt by the section timer 22 of the last unit strobe pulses 72 from the loops 58 and 66 in the left-hand and right-hand columns of passenger locations will produce simultaneous flashes of the LED indicators 108, 110, 112 and 114. The failure of the LED indicators 108, 110, 112 and 114 to concurrently sense the last strobe pulses 72 informs the instrument operator that concurrence of strobe pulses in both loops to a passenger location is absent.

INTERFACE CONNECTIONS

The interface between the instrument 36 and the multiplexed passenger reading light and attendant call system 20 of FIG. 1 is diagrammatically depicted in FIG. 4. The instrument panel 36 is connected by an umbilical cable sheath 116 which contains 5 cables, 118, 120, 122, 124 and 126. The cable 118 is connected to the connector 42 that is interposed between the plug connection P4 from the right column overhead decoders 26 and the jack connection J4 on the section timer 22. The connector 42 includes a jack connection J4 which mates with the plug P4 and a plug connection P4A which mates with the jack connection J4. Similarly, the connector 40 at the extremity of the cable 120 is connected to the plug connection P2 leading to the right column seat encoders 24 and to the jack connection J2 of the section timer 22.

The connector 38 at the extremity of the cable 122 is connected to the plug connector P5 leading to the aircraft cockpit and to the jack connector J5 of the section timer 22. Jack connection J5A mates with plug P5 and plug connection P5A mates with jack J5. The connector 44 at the extremity of the cable 124 has a jack connection J1A which is connected to the plug P1 that leads to the seat encoders 24 of the left column of passenger locations 28a, 28b, 28c. . . . The connector 44 also has a plug connection P1A which is connected to the jack connector J1 of the section timer 22. The connector 46 at the extremity of the cable 126 has a jack connection J3A which is connected to the data line 66 leading to the overhead decoders 26 in the left-hand column of passenger locations 28a, 28b, 28c . . . The connector 46 also has a plug connection P3A which is connected to the section timer jack connection J3. All of the cables 118, 120, 122, 124 and 126 should be at least 10 feet in length.

LOGIC CIRCUITRY

The operation of the circuitry of the instrument 35 of the invention may best be explained by reference to FIGS. 3A and 3B. The clock pulse line 104 is connected to line 120 in the instrument 35, illustrated in FIG. 3A. The clock pulse line 120 is split and is connected through resistors to two voltage comparators ICA and ICB. The opposing input to voltage comparator ICA is connected to a −15 volt supply through a resistor 122 by a line that is connected to ground through a resistor 124. The opposing input of voltage comparator ICB is connected to a positive 15 volt supply through a resistor 122 by means of a line that is coupled to ground through a resistor 124.

The voltage comparator ICA therefore produces a negative-going clock pulse 102 on line 126 which is directed through an inverter 128 to line 130. From the line 130 the inverted clock pulse is connected to an AND gate IC27C and also to a dividing circuit 132 which produces one output pulse for every 2048 input clock pulses. The output of the dividing circuit 132 is connected to the light emitting diode 96, designated as CLOCK in FIG. 2. The LED 96, therefore, pulsates in a properly operating circuit at a rate which is equal to 35000 hertz divided by 2048.

The other voltage comparator ICB detects positive-going pulses and provides an output which is inverted by an inverter 134 and passed to a resettable monostable multivibrator IC25. In this fashion the voltage comparator, ICB separates the sync pulses 100 from the clock pulses 102, depicted in FIG. 8, and passes the sync pulses 100 to the resettable monostable multivibrator IC25.

A sync pulse 100 is produced by the section timer 22 each time a strobe pulse 72 is received by the section timer 22. The resettable monostable multivibrator IC25 is used to lengthen the pulse width of the sync pulses 100. An adjustable resistor 136 is used to vary the pulse duration of the output of the resettable monostable multivibrator IC25 and a resistor 137 and a capacitor 138 are also employed to set up the timing in the resettable monostable multivibrator IC25. The output of IC25 is directed through line 139 to IC26, a Dual D flip-flop, wired to divide by two and by four. The divide by four output drives LED 98 to indicate sync pulses at a rate visible to the operator. The divide by two output provides square wave pulses 117 having a duration of one-half of a cyclic duty cycle between successive sync pulses 100 as depicted in FIG. 9.

A Q output of the multivibrator IC25 appears on line 139 and is directed to the clock input of a dual D flip-flop circuit IC26. The output on line 140 carries a pulse to the light emitting diode 98 at one half the rate of the input on line 139. The LED 98 is designated as HYPER PULSE in FIG. 1. Since the circuit IC26 is a dual flip-flop the outputs on lines 141 and 142 occur at one-quarter the input rate on line 139.

The output of the dual flip-flop circuit IC26 is directed to an analog switch IC23. Selection of the line 141 or 142 by the switch IC23 is controlled by the SYNC switch S7. Should the timing of the system be thrown off due to switching a data line, the SYNC switch S7 can be actuated to pick up the next divided sync signal which appears on the line 141 or 142 to which the switch IC23 is thrown. This, in effect, resets the instrument 35 should a timing problem therein develop.

The output of the monostable multivibrator IC25 is also directed on a line 143 through an inverter IC22A to one input ot the AND gate IC27C. The AND gate IC27C produces an output on line 144 upon the occurrence of a divided sync pulse with the next available clock pulse. The pulses overlap since the pulse wave form 117, depicted in FIG. 9, is of a duration so as to overlap a clock pulse 102 (FIG. 8) in time.

The output pulses from switch IC23 are directed to an OR gate IC28B which provides a load signal to two programmable divide-by-N counters IC32 and IC33. The counters IC32 and IC33 are permanently wired to divide by 19. Therefore, an output from OR gate IC28B on line 145 produces a load signal to both the counters IC32 and IC33 which causes them to be loaded with a count of 19.

The divided sync signal from switch IC23 is also connected to the load inputs of two other divide-by-N counters IC29 and IC30. These counters are programmed by the thumbwheel switches S8 and S9 which are moved manually to produce loading signals indicative of the selection of the passenger location in association with which data is to be displayed. The thumbwheel switches S8 and S9, can be programmed to any number between 1 and 34. The programmable counters, IC29, IC30, IC32 and IC33, are thereby synchronized together by the output from switch IC23.

The clock pulses on line 144 pass from the AND gate IC27C to clock the counter IC33 which is cascaded with the counter IC32. Beginning with the programmed count of 19, the counters IC32 and IC33 count down to zero in coincidence with clock pulses on line 130. When the counters IC32 and IC33 have both counted down to zero, the OR-gate IC28A produces an output to Or-gate IC28B to reload the counters IC32 and IC33 with the number 19. Therefore, with every 19 clock pulses the counters IC32 and IC33 will be reloaded with the number 19. The pulse 117 on line 143 operates at a 50% duty cycle, so that during half of the duty cycle line 143 is high and the other half, line 143 is low. When pulse 117 is high, IC29, IC30, IC32 and IC33 are reset to begin a new count cycle.

The clock pulses on line 144 are also fed to an AND gate IC27D which has an output coupled to the shift register chips which are connected together as a latch. These shift register chips include IC11, IC12, IC13, IC17 and IC18. These shift register chips are CMOS, 8 bit, serial in, parallel-out devices. The output of AND-gate IC27D is directed to each of these chips and serves as a latching signal.

The AND-gate IC27D produces a latching output signal only when an enabling signal appears on line 50. The enabling signal on line 50 occurs only when the passenger location selected by the selector 48 is interrogated. The selector 48 includes the thumbwheel switches S8 and S9, the counters IC29 and 30, the binary coded decimal decoder chip IC31 and the AND-gate IC27A. The counters IC29 and IC30 are not clocked by the clock pulses, but rather by the zero output from counter IC33. A zero output from IC33 is produced on line 148 with every occurrence of 19 clock pulses.

If, for example, there are 17 passenger locations in a column, the switches S8 and S9 may be set to the number 17. The counter IC29 registers the ten's position which is a "1" and IC30 registers the unit's position which is "7". With each cycle through the counters IC32 and IC33 the counters IC29 and IC30 will be counted down by one. This means that the system will ignore the first 16 cycles of the counters IC32 and IC33, and the AND gate IC27A will only open with the occurrence of the seventeenth cycle. The AND-gate IC27A is actuated by the output of decoder IC31. The decoder IC31 is wired into the counter IC30. Whenever the output of IC30 is a "1", a valid output will be produced from the decoder IC31 to the AND-gate IC27A. AND-gate IC27A will produce an enabling signal 50' on line 50 only if it receives both a "1" from the decoder IC31 and if there is a zero output from IC29. The enable signal 50' on line 50 lasts for exactly 19 inverted clock pulses $\overline{102}$, as illustrated in FIG. 10. Therefore, the AND-gate IC27D passes exactly 19 inverted clock pulses $\overline{102}$ during the enable signal 50' to the shift register latches IC11, IC12, IC13, IC17 and IC18.

During an enable signal 50' the shift register modules clock the inputs on lines 151 and 152 (FIGS. 3A and 3B) nineteen times. The input on line 151 represents the data from the seat encoder addressed, while the input on line 152 represents the output from the section timer 22 to the overhead decoder 26 which is concurrently addressed. The LED's in the instrument panel 36 indicative of the seat encoder and overhead decoder data, illustrated in FIG. 2, are wired to the shift register modules as indicated in FIGS. 3A and 3B. The shift register IC17 is provided without light emitting diodes because of the position of the overhead decoder reading light condition data in the data train. Each of the LED's connected to the shift registers IC11, IC12, IC13, IC17 and IC18 is powered by a positive 15 volt power supply through a 2.7 K ohm resister. The shift register modules provide the path to ground, depending upon the data present therein. After the nineteenth clock pulse the data will remain in the shift register modules until the next interrogation cycle at the selected passenger location, at which time the data in the shift registers will be updated.

The data to the shift registers IC11, IC12, IC13, IC17 and IC18 originates from the analog switches IC1, IC2, IC3 and IC4, also depicted in FIGS. 3A and 3B. The data is supplied to the analog switches on data line extensions 154, 155, 156 and 157 for the seat encoder inputs. The forward data line extensions 154 and 155 from the forward data lines 60 to the seat encoders 24 are directed to NOR-gates IC8B and IC8A, the outputs of which are directed to a NOR-gate IC8D. The forward data lines extensions 156 and 157 from the forward data lines 68 to the overhead decoders are directed to the switches IC3 and IC4. The outputs 156' and 157' are connected to the NOR-gates IC16B and IC16A which provide inputs to the NOR-gate IC16D. The output of NOR-gate IC16D appears at line 152.

The NOR-gates IC8A, IC8B, IC16A, IC16B will accept either one or the other, but not both inputs concurrently, and are wired to the column select switch S6. Therefore, the data which is directed to the shift register modules IC11, IC12, IC13, IC17 and IC18 will be the data associated with either the left or right column of passenger locations. If switch S6 establishes electrical continuity with contact 158, data from the left passenger locations 28a, 28b, 28c . . . will be available to the shift registers. If switch S6 establishes electrical continuity with contact 159, the data available to the shift registers will be from the right column of passenger locations 30a, 30b, 30c . . . The inverter 160 ensures either that NOR-gate IC16A and NOR-gate IC8A are selected, or that NOR-gates IC16B and IC8B are selected.

The enable signal 50' on line 50 is also used to register the last unit strobe pulses 72 when switches S8 and S9 are dialed to the total number of passenger locations in the column interrogated. The enable signal 50' is directed through an inverter 163, depicted in FIG. 3A, and passed on line 164 to NOR-gates IC6A, IC6B, IC14A, and IC14B as a negative-going pulse. With the negative pulse input, each of these NOR-gates will provide an output if the other input thereto is high. The NOR-gates IC6A, IC6B and IC14A, IC14B are not monitoring the forward data line, which carries the data associated with the passenger position designated by the selector devices 48. Rather, these NOR-gates are monitoring the backward data line extensions 165, 166, 167 and 168. Accordingly, if the strobe pulses 72 appear on line 165, 166, 167 and 168 during the $\overline{\text{ENABLE}}$ pulse on line 164, outputs will be provided to the flip-flops IC7 and IC8.

An output from NOR-gate IC6A will illuminate the last unit strobe LED 108 while an output from NOR-gate IC6B will illuminate the last unit strobe LED 110. An output from NOR-gate IC14A will illuminate the last unit strobe LED 112 and an output from NOR-gate IC14B will illuminate the last unit strobe LED 114. In a properly operating system the LED's 108 and 110 will be illuminated concurrently, since the strobe pulses 72 from the seat encoder data loop 58 and the overhead decoder data loop 66 associated with the left-hand passenger positions 28a, 28b, 28c . . . must produce strobe pulses 72 concurrently. Similarly, illumination of the last unit strobe LED's 112 and 114 on the right column of passenger locations must occur concurrently.

The outputs from each of the NOR-gates IC6A, IC6B, IC14A and IC14B set the inputs of flip-flops IC7 and IC8. IC7 is a dual D flip-flop, as is IC8. The SYNC pulse from switch IC23 is passed through an inverter 170 and is transmitted as a $\overline{\text{SYNC}}$ pulse on line 171 to the clock inputs of the flip-flop circuits IC7 and IC8 to reverse the set condition of those flip-flops. The LED's 108 and 110 will thus pulse concurrently with each other, as will the LED's 112 and 114, provided that the last unit strobe pulses 72 from each of the seat encoder data lines and overhead decoder data lines in the column addressed are received concurrently. If the last unit strobe pulses 72 are not received concurrently, concurrent pulsing of the associated LED's will not occur and a fault as indicated in the column whose LED fails to pulse concurrently.

The analog switches IC1, IC2, IC3 and IC4 are all CMOS, double throw, analog switches. These switches are three pole switches, although only two of the poles are utilized. As previously noted, the switch S1 may be employed to reverse the seat encoder data to provide data on the forward data lines 60 to the backward data line extensions 165 and 166 and data on the backward data lines 62 to the forward data line extensions 154 and 155. Likewise, the switch S2 may be employed to carry data from the forward data lines 68 to the backward data line extensions 167 and 168 and data from the backward data lines 70 to the forward data line extensions 156' and 157'.

Meter Measurements

The instrument 35 also employs sample and hold circuits 170 and 190 which are coupled to the meter 172 depicted in FIGS. 2, 3B and 5 by means of a toggle switch S10, which can be switched between a SEAT position in electrical communication with contact 173, and an OVERHEAD position in which it is communication with contact 174 in FIG. 3B.

With reference to FIG. 3A, the sample and hold circuit 170 is connected to the seat encoder loop 58 through an analog switch IC9 which is controlled by the selector 48. The sample and hold circuit 170 thereby stores a signal indicative of the voltage drop at the passenger location selected by the selection means 48 in the seat encoder loop 58. The indicator, in the form of the meter 172, is coupled to the sample and hold circuit 170 by the switch S10, as indicated in FIG. 3B.

The data from the seat encoders 24 appears on the forward data lines extensions 154 and 155 in FIG. 3A. This data is directed through operational amplifiers 176 and 177 to the terminals of the single pull, double throw analog switch IC9. The amplifiers 176 and 177 are internally wired as voltage followers and are used as buffers. The switch IC9 includes one switch contact 178 which is operated by the AND-gate IC5C. The AND-gate IC5C passes a signal only when the switch S6 is operated to designate the left-hand column and when an enable signal 50' is received on line 50 in coincidence with a signal through AND-gate IC34C.

AND-gate IC34C can produce an output when the enable pulse 50' is produced. This can only occur at the time the section timer 122 is interrogating the seat encoder 24 at the passenger location designated by the selector 48. In order for the AND-gate IC34C to provide an output, however, it must also receive an input from AND-gate IC34D. The AND-gate IC34D is wired through another AND-gate IC34A to the counter IC33 and receives a direct input from the counter IC32. Both inputs to the AND-gate IC34D will be high when the counters IC32 and IC33 have been counted down to the digital number 16 from their preset count of 19. This occurs with the fourth clock pulse on line 144. At that time either the switch 178 or the switch 179 (depending upon the condition of switch S6) will close. The fourth data pulse in the pulse train to the selected seat encoder 24 will thereupon be transmitted to the operational amplifier 181. The voltage level of that data pulse is stored in a capacitor 182 and that voltage level is directed through the amplifier 181 to the meter 172 with the switch S10 in the position indicated. The fourth data pulse in the data train is from the left-most seat at the passenger location under interrogation. This voltage level is updated with the voltage level of that same data pulse with each cycle of interrogation.

As depicted in FIG. 1, the seat encoders 24 all include an analog switch 64. The analog switches 64 of the seat encoders 24 are series connected in the seat encoder loop 58. As depicted in FIG. 6, these analog switches 64, when closed, appear as resistances to a voltage supply which is applied at 175 in the section timer 22 through a pullup resistor 176. A transistor 177 within the section timer 22 provides data signals to the seat encoder 24 which is being interrogated. The seat encoder 24 being interrogated is not seen as a resistance by the section timer 22, since the analog switch 64 therein is not closed. Rather, the seat encoder 24 being interrogated provides a path to ground or an open circuit to provide data to the section timer 22.

In FIG. 6 the seat encoder 24 associated with the passenger location 28d is depicted. Actuation of the reading lamp in the left-most seat at this passenger location will effectively produce a ground within the seat encoder 24 at passenger location 28d during the fourth data pulse. Because there are three analog switches 64 between the connection of the sample and hold circuit 170 to the forward data line 60, and because there is a pull-up resistor 176 between the connection of the sample and hold circuit 170 and the positive 15 volt supply at 175, some finite voltage level will appear and will be sampled and held by the circuit 170 during the monitored data pulse.

The voltage level sampled by the circuit 170 will be lowest when the first passenger location 28a or 30a is interrogated, since there will be no resistance from the series connected closed analog switches 64 between the connection 179 of the sample and hold circuit 170 to the forward data line 60 and the ground through the interrogated seat encoder 24. Accordingly, the voltage level at meter 172 should be near zero, and no greater than one volt when passenger location 28a is sampled. Conversely, at the last passenger location 28j, all of the prior analog switches 64 will be connected in series with the voltage supply at 175 and the ground through the seat encoder 24 at passenger location 28j. Accordingly, the additional resistances presented by the closed analog switches 64 at the passenger locations 28a-28i will cause the voltage transmitted to the sample and hold circuit 170 to be considerably higher at passenger location 28j.

By sequentially sampling the passenger locations one can observe when inordinatly large voltages appear on the meter 172. This will isolate to a particular seat encoder, trouble that may not even be reflected in the operation of the reading light and call indicators at that passenger position. Indeed, an inordinatly large switch resistance at the passenger location 28d may be reflected overtly only by malfunctions further along the loop 58. For example, the voltage level of the data pulse at passenger location 28d may be sufficient for proper operation of the seat encoder 24 and decoder 26 at that passenger location. Because of inordinately high resistance introduced at that location, however, the data pulses further along the loop, for example at location 28g, may be sufficiently degraded by the cummulative resistance of the analog switches 64 at the passenger locations 28a-28f to produce a malfunction. Thus the malfunction would appear to be at passenger location 28g, where in fact it might be attributable to an inordinatly large resistance of the analog switch 64 at passenger location 28d. Such a problem cannot be discovered with prior art techniques, but can be identified with the instrument of the invention by means of the sample and hold circuit 170 and the meter 172.

A comparable sample and hold 190, depicted in FIG. 3B, is associated with the overhead decoder loop 66. The sample and hold circuit 190 provides a signal to the meter 172 when the switch S10 establishes electrical continuity with the contact 173 to allow trouble-shooting in the overhead decoder analog switches 64, as depicted in FIG. 7. The difference in operation is that the seat encoders 24 transmit to the section timer 22, whereas the section timer 22 transmits to the overhead decoders 26. With reference to FIG. 7, the sample and hold circuit 190 affectively breaks the connection from the forward data line 68 and establishes a tap to the sample and hold circuit 190 across a resistor 192 connected to ground. The resistor 192 has a known load, approximately 10k ohms. In the circuit of FIG. 7 the positive 15 volt supply in each overhead decoder 26 is directed through a pull-up resistor 194. A transistor 195 in the overhead decoder 26 provides a data pulse which diminishes in voltage in proportion to the number of analog switches 64 through which it must pass. Thus, the data pulse from the overhead decoder 26 in the passenger location 28j is normally the weakest to the section timer 22, while data pulses from the overhead decoder 26 at passenger location 28a are the strongest. With the sample and hold circuit 190 connected as depicted in FIG. 7, inordinatly large voltage drops across the analog switches 64 can be detected in sequentially testing the passenger locations 28a-28j.

The problems which can be solved with the sample and hold circuits 170 and 190 are among the most difficult encountered in connection with a multiplexed passenger reading light and attendant calling system 20. The reason is because the grounds which are placed on the system through the seat encoder 24, in the case of the seat encoder data loop 58 do not always appear as true grounds to the section timer 22. That is, if there is an inordinatly high resistance in one of the analog switches 64, the voltage at 179 directed to the section timer 22 is not truly at ground, but is some voltage level above ground. Moreover, the problem may not be apparent in the operation of the reading light controls and call buttons at the passenger location at which the problem lies. The signal therefrom may be marginal, but may still be acceptable to the section timer 22. However, the degradation produced by the analog switch 64 at a passenger location may adversely affect signals from passenger locations further along in the loop 58. Such problems were previously undetectable using prior art malfunction location techniques, but are readily ascertainable using the sample and hold circuits 170 and 190 in the instrument 35 of the present invention.

Exemplary component designations and appropriate circuit element values are set forth in Appendix A, attached hereto. Undoubtedly, numerous variations and modifications of the invention will become readily apparent to those familiar with aircraft multiplexed passenger reading light and flight attendant call systems. The invention should therefore not be construed as limited to the specific embodiment depicted, but rather as defined in the claims appended hereto.

APPENDIX A

| Resistors | Capacitors |
|---|---|
| 119–10K ohms | 138–.015 microfarad |
| 122–68K ohms | |
| 124–100K ohms | |
| 136–50K ohms | |
| 137–33K ohms | |
| 197–2.2K ohms | |
| 199–30K ohms | |

I claim:

1. An instrument for locating malfunctions in a multiplexed aircraft passenger reading light and attendant call control system having a plurality of passenger locations and a section timer coupled to sequentially address said passenger locations by passing electrically encoded data to and from a seat encoder with reading light switches and an overhead decoder with reading lights located thereat, at each passenger location comprising:

interface connection means which couples said seat encoders and said overhead decoders to said section timer to receive electrically encoded data from said seat encoders and to transmit electrically encoded data to said seat encoders and said overhead decoders,     selection means for selectively designating the sequential position of one of said plurality of passenger locations and for identifying a designated passenger location, register means coupled to said selection means to register a number corresponding to the sequential position of said designated passenger location, decrementing means responsive to advancement of said section timer from one passenger location to the next to decrement said register means, enabling means coupled to said register means for generating an enabling signal when said register means is fully decremented, temporary storage means connected to said enabling means and coupled to said section timer to latch digital data derived from said section timer and associated with said designated sequential passenger location position in response to said enabling signal, and display means coupled to said temporary storage means for visually indicating said data latched therein.

2. An instrument according to claim 1 wherein said display means includes a call switch actuation indicating means responsive to data from said seat encoders and separate reading light actuation indicators for each of a plurality of seats at a selected passenger location responsive to data from said seat encoders.

3. An instrument according to claim 2 wherein said display means includes indicators coupled to and illuminated by said section timer in accordance with data from said section timer to said overhead decoder at said selected passenger location.

4. An instrument according to claim 2 further characterized in that said seat encoders and said overhead decoders are connected to said section timer by separate data lines, and a clock line connects said section timer to said seat encoders and said overhead decoders, and said section timer includes means for producing a sync pulse at the completion of each cycle of interrogation of all passenger locations, and transmits clock pulses and sync pulses on said clock line, and said display means further comprises a clock pulse indicator and a sync pulse indicator coupled to said clock line.

5. An instrument according to claim 4 further comprising dividing circuitry means having dual outputs which alternatingly carry divided sync signals, and sync switching means for alternatively and selectively coupling one of said dual outputs to said register means for resynchronizing said selection means to operate in timed relationship with said sync pulses.

6. An instrument according to claim 1 further comprising overhead decoder data indicators coupled to said selection means to concurrently display data indicative of a strobe to said selection timer by an overhead decoder when said selection means designates the last of said plurality of passenger locations.

7. An instrument according to claim 1 further comprising passenger location switching means coupled to said selection means to select data from the seat encoder of one passenger location for display and to contemporaneously select data from the section timer to the overhead decoder at a different passenger location for display in said overhead decoder data indicators.

8. An instrument according to claim 7 further characterized in that said seat encoders of at least some of said passenger locations are arranged in a seat encoder loop that includes a forward data line which leads from said section timer and serially connects said seat encoders and a backward data line that provides a signal path from the last of said serially connected seat encoders to said section timer, and the overhead decoders at said same passenger locations are serially connected in an overhead decoder loop, in correspondence to said seat encoder loop, in a forward data line which leads from said section timer through said serially connected overhead decoders and a backward data line that provides a signal path from the last of said serially connected overhead decoders to said section timer, and said section timer includes alternating means for cyclically coupling said section timer to first one data lines of said data loops and then to an opposite data line of said data loops, and further comprising switching means for suppressing said alternating means and for selectively confining addressing by said section timer to said forward data lines and alternatively to said backward data lines.

9. An instrument according to claim 8 further characterized in that said seat encoders are connected to said section timer in parallel loops corresponding to parallel columns of passenger locations, each loop having a forward and a backward data line and said overhead decoders are also connected to said section timer in corresponding parallel loops corresponding to parallel columns of passenger locations, each loop having a forward and a backward data line and said interface connection means includes separate connections from each of said parallel columns, and further comprising switching means interposed between said temporary storage means and said separate connections from each of said parallel columns to selectively couple said separate connections from a single one of said parallel columns to said temporary storage means to select a single column.

10. An instrument according to claim 8 further characterized in that each of said serially connected seat encoders and each of said serially connected overhead decoders generates a strobe pulse upon being addressed by said section timer, and said section timer addresses said seat encoders and said overhead decoders on said loops concurrently, and further comprising last strobe sensing means connected to said seat encoder loop and said overhead decoder loop of the same passenger locations to detect strobe pulses from the last seat encoder and the last overhead decoder addressed in said loops, and fault indicating means connected to said last strobe sensing means to register the failure of said last strobe sensing means to concurrently receive strobe pulses from the last seat encoder addressed in said seat encoder loop and the last overhead decoder addressed in said overhead decoder loop.

11. An instrument according to claim 10 further characterized in that each of said seat encoders transmits parity pulses of opposite polarity in response to a strobe pulse thereto, and said display means further comprises means coupled to said temporary storage means for indicating the polarity of said parity pulses.

12. An instrument according to claim 8 further characterized in that an analog switch couples each of said seat encoders and each of said overhead decoders to said loops, and said analog switches in each loop are series connected to receive a voltage supply through a pull-up resistance with each data pulse, and further comprising a sampling circuit coupled to at least one of said loops under the control of said selection means to thereby store a signal indicative of voltage drop at an analog switch at said selected passenger location and indicator means coupled to said sampling circuit to display said voltage drop.

13. An instrument according to claim 12 wherein said interface connection means includes separate connections from said seat encoder loop and said overhead decoder loop and further comprising an encoder/decoder switching means interposed between said connections from said encoder loop and said overhead decoder loop to selectively and alternatively complete electrical continuity therefrom to said indicator means to alternatingly switch said indicator means between said seat encoder loop and said overhead decoder loop.

14. In an instrument for locating malfunctions in a multiplexed aircraft passenger reading light and attendant call control system having a plurality of passenger locations controlled by a section timer for sequentially addressing said passenger locations by passing electrically encoded data to and from a seat encoder with reading light switches and attendant call switches and an overhead decoder with reading lights located thereat, at each passenger location and the seat encoders of at least some of said passenger locations are connected with the seat encoders thereof arranged in a seat encoder loop that includes a forward data line which leads from said section timer and serially connects said seat encoders and a backward data line that provides a signal path from the last of said serially connected seat encoders to said section timer, and the overhead decoders at said same passenger locations are serially connected in an overhead decoder loop, in correspondence to said seat encoder loop, in a forward data line which leads from said section timer through said serially connected overhead decoders and a backward data line that provides a signal path from the last of said serially connected overhead decoders to said section timer, connection means which couple said seat encoders and said overhead decoders to said section timer, to receive electrically encoded data from said seat encoders and to transmit electrically encoded data to said seat encoders and to said overhead decoders, and said section timer includes alternating means for cyclically coupling said section timer to the forward data lines of said data loops and alternatingly to the backward data lines of said data loops, the improvement comprising a switching means for suppressing said alternating means in said section timer and for selectively confining addressing by said section timer to said forward data lines and alternatively to said backward data lines.

* * * * *